US010565931B2

(12) United States Patent
Jung

(10) Patent No.: US 10,565,931 B2
(45) Date of Patent: Feb. 18, 2020

(54) ORGANIC LIGHT EMITTING DISPLAY AND APPARATUS FOR DRIVING SAME

(71) Applicant: LG Display Co., Ltd., Seoul (KR)

(72) Inventor: DaeSung Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 149 days.

(21) Appl. No.: 15/724,780

(22) Filed: Oct. 4, 2017

(65) Prior Publication Data

US 2018/0114488 A1    Apr. 26, 2018

(30) Foreign Application Priority Data

Oct. 25, 2016 (KR) .................. 10-2016-0138972

(51) Int. Cl.
*G09G 3/3258* (2016.01)
*H01L 27/32* (2006.01)
*G09G 3/3266* (2016.01)
*G09G 3/3275* (2016.01)

(52) U.S. Cl.
CPC ....... *G09G 3/3258* (2013.01); *H01L 27/3244* (2013.01); *G09G 3/3266* (2013.01); *G09G 3/3275* (2013.01); *G09G 2300/0439* (2013.01); *G09G 2310/0286* (2013.01); *G09G 2330/04* (2013.01); *H01L 27/3213* (2013.01)

(58) Field of Classification Search
CPC .. G09G 3/3258; G09G 3/3233; G09G 3/3266; G09G 3/3275; G09G 2300/0439; G09G 2300/0819; G09G 2300/0861; G09G 2310/0286; G09G 2320/0238; G09G 2330/04; H01L 27/3244; H01L 27/3213
See application file for complete search history.

(56) References Cited

U.S. PATENT DOCUMENTS

| 2006/0244691 A1* | 11/2006 | Lee ................... G09G 3/3233 345/76 |
| 2011/0115772 A1 | 5/2011 | Chung |
| 2012/0161637 A1 | 6/2012 | Lee et al. |
| 2013/0141316 A1 | 6/2013 | Lee et al. |
| 2014/0333513 A1* | 11/2014 | Park ................... G09G 3/3266 345/76 |

(Continued)

FOREIGN PATENT DOCUMENTS

| CN | 1797508 A | 7/2006 |
| CN | 101266757 A | 9/2008 |
| CN | 101859536 A | 10/2010 |

(Continued)

OTHER PUBLICATIONS

Office Action issued in Taiwanese Patent Application No. 106127378 dated Feb. 7, 2018.

(Continued)

*Primary Examiner* — Sahlu Okebato
(74) *Attorney, Agent, or Firm* — Polsinelli PC

(57) ABSTRACT

The present disclosure relates to an organic light emitting display and an apparatus for driving the same. According to the present aspects, a first light emitting transistor can be maintained to be in a turn-off state from an initial interval to a holding interval, whereby a short-circuit between data voltage and reference voltage, which occurs when the first light emitting transistor is turned on in the initial interval, can be prevented.

20 Claims, 12 Drawing Sheets

(56) References Cited

U.S. PATENT DOCUMENTS

2015/0371584 A1* 12/2015 Lin ................. G11C 19/28
 345/214
2016/0063921 A1 3/2016 Tsai et al.

FOREIGN PATENT DOCUMENTS

CN 104464630 A 3/2015
TW 201546791 A 12/2015

OTHER PUBLICATIONS

Extended European Search Report issued in European Patent Application No. 17190766.0 dated Feb. 27, 2018.

* cited by examiner

Initial interval

ORGANIC LIGHT EMITTING DISPLAY AND APPARATUS FOR DRIVING SAME

CROSS REFERENCE TO RELATED APPLICATION

This application claims priority from Korean Patent Application No. 10-2016-0138972, filed on Oct. 25, 2016, which is hereby incorporated by reference in its entirety for all purposes as if fully set forth herein.

BACKGROUND

Field of the Disclosure

The present disclosure relates to a display device, and more particularly, to an organic light emitting display and an apparatus for driving the same. Although the present disclosure has a wide scope of applications, it is particularly suitable for reducing the number of devices and the area for circuits of the organic light emitting display, thereby reducing the size of a bezel of the organic light emitting display.

Description of the Background

An active matrix type organic light emitting display includes a self-luminous organic light emitting diode (hereinafter, referred to as an "OLED") and is advantageous in that a response speed is fast, light emitting efficiency and luminance are high, and a viewing angle is wide. The OLED includes an organic compound layer formed between an anode and a cathode. The organic compound layer includes a hole injection layer (HIL), a hole transport layer (HTL), an emission layer (EML), an electron transport layer (ETL), an electron injection layer (EIL), or the like. When a driving voltage is applied to the anode and the cathode of the OLED, a hole having passed through the hole transport layer (HTL) and an electron having passed through the electron transport layer (ETL) move to the emission layer (EML) to form an exciton, and consequently the emission layer (EML) emits visible light.

An organic light emitting display may be driven by a duty driving method. To implement the duty driving method, a light emission control signal (hereinafter, referred to as an "EM signal") should be applied to each of subpixels. The EM signal is generated as an alternating current signal alternating between an ON level defined as a light-on time of each of subpixels and an OFF level defined as a light-off time of each of subpixels, and light-on and light-off time of each of subpixels is referred to as a duty ratio of the EM signal. In a p-type metal oxide semiconductor field effect transistor (MOSFET), an ON level is a low logic level, and an OFF level is a high logic level.

To implement the duty driving method, an EM driver capable of switching the EM signal between the ON level and the OFF level at a desired time is required, and the EM driver includes a shift register for sequentially generating scan signals and an inverter for reversing the output of the shift register. Also, each subpixel has a pair of switch devices turned on or off by the EM signal, in which one switch device switches current supply of the OLED according to the EM signal, and the other switch device switches supply of reference voltage. Since the pair of switch devices is different in a turn-on time or a turn-off time, an additional EM signal should be provided, and accordingly a pair of EM drivers should be arranged for one subpixel. That is, for one subpixel, a pair of shift registers and a pair of inverters are arranged.

The EM driver may be formed in a bezel region of a display panel, and the bezel region is a non-display region arranged at the edges of the display panel. As described above, in the conventional organic light emitting display including a pair of EM drivers, since the circuit area of the EM driver is relatively large, the bezel region of the display panel inevitably becomes widened. Accordingly, it is difficult to implement a narrow bezel. Also, a layout space of the circuit is reduced, so that it is difficult to implement the circuit.

SUMMARY

The present disclosure has been made to solve this problem, and the present disclosure is to provide an organic light emitting display and an apparatus for driving the same, which has a reduced number of devices included in a circuit and thus has a reduced area of the circuit, so as to reduce the size of a bezel.

An aspect provides a display panel having multiple pixels, each of which has a plurality of subpixels, arranged therein in a matrix form. The aspect provides a data driver that supplies data voltage to the display panel. The aspect provides a scan driver that supplies a scan signal synchronized with the data voltage. The aspect provides a duty driver that generates a light emission control signal for controlling a duty of the data voltage provided to the plurality of subpixels. The aspect provides a subpixel circuit including a light emitting device, a driving device that controls providing of driving voltage to the light emitting device, a second light emission control device that is turned on or off upon reception of a light emission control signal from the duty driver, so as to control a duty of the driving voltage provided to the light emitting device, and a first light emission control device that is turned on and off by receiving a light emission control signal provided from a duty driver of a neighboring subpixel.

Another aspect provides an apparatus for driving an organic light emitting display having a plurality of subpixels that are turned on and off during a duty driving period according to a light emission control signal. The apparatus includes a duty driver that generates a light emission control signal that controls a duty of data voltage provided from the plurality of subpixels, and includes a plurality of shift registers corresponding to the plurality of subpixels, respectively. The aspect provides the apparatus for driving an organic light emitting display, in which each of the plurality of shift registers is configured to provide the same light emission control signals to a pair of neighboring subpixels, so as to control a pair of different light emission control signals to be provided to each of the subpixels.

A further aspect provides an organic light emitting display comprising a display panel having a plurality of subpixels including neighboring first and second subpixels, a data driver supplying a data voltage to the display panel and a scan driver supplying a scan signal synchronized with the data voltage includes a light emission driver sequentially supplying first and second light emission control signals to first and second light emission control lines to configure to provide the same light emission control signals to the neighboring first and second subpixels; a first light emission control device on the first subpixel and receiving the second light emission control signal through the second light emission control line; and a second light emission control device on the first and second subpixels, wherein the second light emission control device on the first subpixel receives the first light emission control signal from the first light emission control line, and the second light emission device on the second pixel receives the second emission control signal through the second light emission control line sharing with the first light emission control device on the first subpixel.

According to the present aspects as described above, a first light emitting transistor can be maintained to be in a turn-off state from an initial interval to a holding interval, whereby a short-circuit between data voltage and reference voltage, which occurs when the first light emitting transistor is turned on in the initial interval, can be prevented.

According to the present aspect, an EM driver having one shift resister for each subpixel is arranged, and the number of circuit devices is thus decreased in comparison with the prior art, so that the size of the EM driver is reduced. Therefore, the size of a bezel region where the EM driver is disposed can be reduced.

BRIEF DESCRIPTION OF THE DRAWINGS

The above and features and advantages of the present disclosure will be more apparent from the following detailed description taken in conjunction with the accompanying drawings, in which.

DETAILED DESCRIPTION

Figure 1:
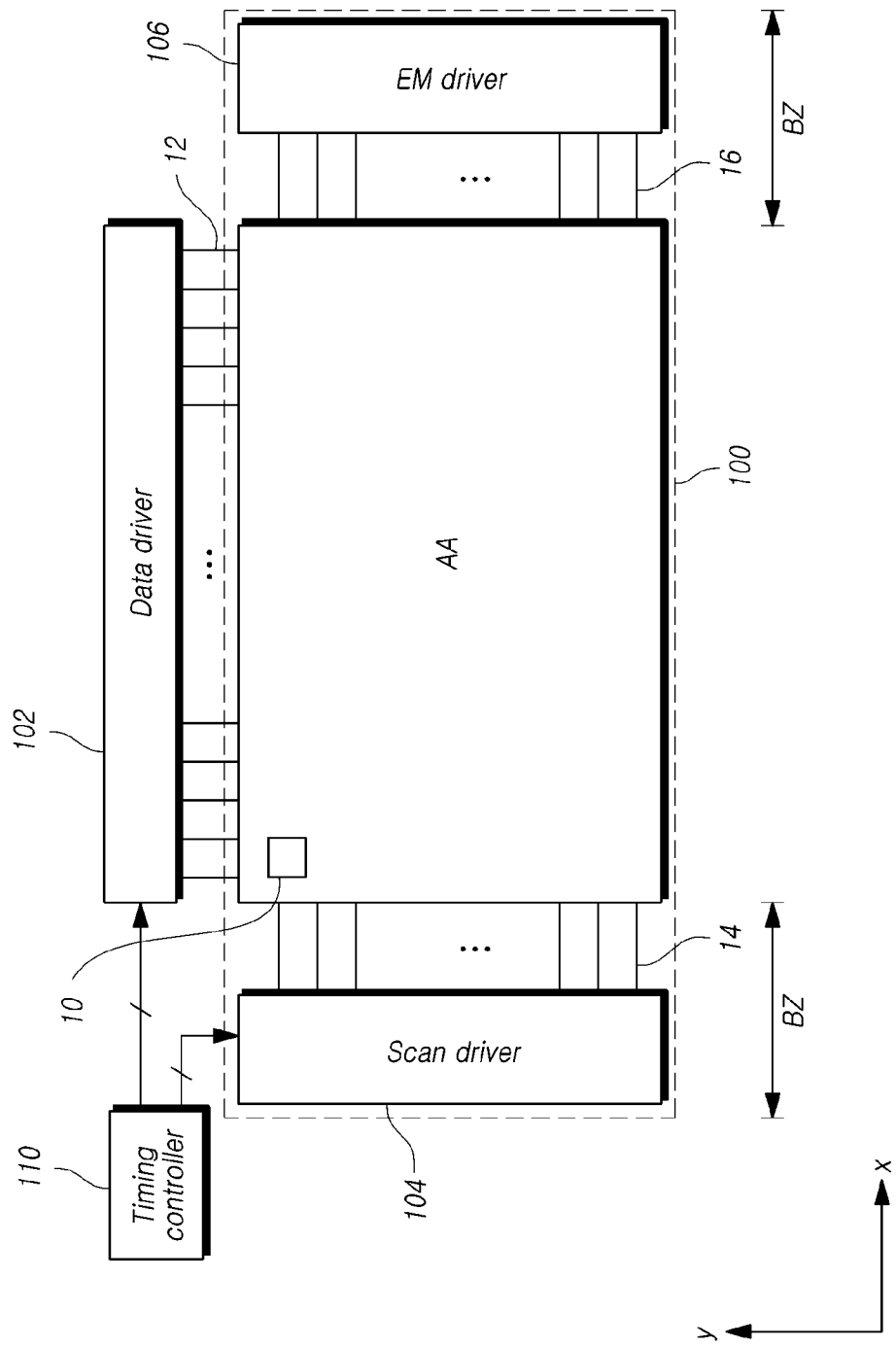
FIG. 1 is a block diagram illustrating an organic light emitting display according to an aspect of the present disclosure.

Hereinafter, aspects of the present disclosure will be described in detail with reference to the accompanying drawings. The following aspects are provided, by way of example, so that the idea of the present disclosure can be sufficiently transferred to those skilled in the art. Therefore, the present disclosure is not limited to the aspects as described below, and may be embodied in other forms. Also, in the drawings, the size, thickness, and the like of a device may be exaggeratedly represented for the convenience of description. Throughout the specification, the same reference numerals designate the same elements.

The advantages and features of the present disclosure and methods of achieving the same will be apparent by referring to aspects of the present disclosure as described below in detail in conjunction with the accompanying drawings. However, the present disclosure is not limited to the aspects set forth below, and may be implemented in various different forms. The following aspects are provided only to completely disclose the present disclosure and inform those skilled in the art of the scope of the present disclosure, and the present disclosure is defined only by the scope of the appended claims. Throughout the specification, the same reference numerals designate the same elements. In the drawings, the dimensions and relative sizes of layers and regions may be exaggerated for the convenience of description.

When an element or layer is referred to as being "above" or "on" another element, it can be "directly above" or "directly on" the other element or layer or intervening elements or layers may be present. In contrast, when an element is referred to as being "directly on" or "directly above" another element or layer, there are no intervening elements or layers present.

Spatially relative terms, such as "below", "beneath", "lower", "above", "upper" and the like, may be used herein for ease of description to describe one element or feature's relationship to another element(s) or feature(s) as illustrated in the figures. It will be understood that the spatially relative terms are intended to encompass different orientations of the element in use or operation in addition to the orientation depicted in the figures. For example, if the element in the figures is turned over, elements described as "below" or "beneath" other elements would then be oriented "above" the other elements. Thus, the exemplary term "below" can encompass both an orientation of above and below.

In addition, terms, such as first, second, A, B, (a), (b) or the like may be used herein when describing components of the present disclosure. Each of these terminologies is not used to define essence, order, sequence, or number of a corresponding component but used merely to distinguish the corresponding component from other component(s).

FIG. 1 is a block diagram illustrating an organic light emitting display according to an aspect of the present disclosure.

Referring to FIG. 1, an organic light emitting display according to an aspect of the present disclosure includes a display panel 100, a data driver 102, a scan driver 104, an EM driver 106, and a timing controller 110.

The data driver 102 converts input image data received from the timing controller 110 into a gamma compensation voltage under the control of the timing controller 110 so as to generate a data voltage DATA and output the data voltage DATA to data lines 12. The data voltage DATA is supplied to pixels 10 through the data lines 12.

The scan driver 104 sequentially supplies scan signals SCAN to scan lines 14 by using a shift register under the control of the timing controller 110. A scan signal SCAN is synchronized with the data voltage DATA. The shift register of the scan driver 104 may be directly formed on a substrate of the display panel 100 together with a pixel array AA by a gate-driver in panel (GIP) process.

The EM driver 106 is referred to as a light emission driver or a duty driver, which implements a duty driving method by sequentially supplying EM signals EM to EM lines 16 by using a shift register under the control of the timing controller 110. FIG. 1 illustrates the EM driver 106 as a single unit, but the EM driver 106 may be arranged for each pixel line. The shift register of the EM driver 106 may be directly formed on the substrate of the display panel 100 together with the pixel array AA by the GIP process. The EM driver 106 is implemented by including a separate shift register independent of the shift register of the scan driver 104.

The shift register of the EM driver 106 receives a start pulse VST of an OFF level voltage and a shift clock of an ON level voltage to output an EM signal EM, and shift the EM signal EM to shift clock timing. The shift clock includes clocks CLK1-CLK2 having phases to be sequentially shifted.

The shift register of the EM driver 106 includes dependently connected stages. Each of the stages receives the start pulse and the shift clock. The start pulse is toggled one or more times in a light emitting interval, i.e., a duty driving interval, every frame interval, to reverse the EM signal EM. The EM signal is also referred to as a light emission control signal.

The timing controller 110 synchronizes operations of the data driver 102, the scan driver 104, and the EM driver 106 by controlling operation timing of the drivers 102, 104, and 106. The timing controller 110 receives digital video data of an input image and a timing signal synchronized with the data from a host system, which is not illustrated. The timing signal includes a vertical synchronization signal (Vsync), a horizontal synchronization signal (Hsync), a clock signal (CLK), a data enable signal (DE), and the like. The host system may be one of a television (TV) system, a set-top box, a navigation system, a DVD player, a blue-ray player, a personal computer (PC), a home theater system, and a phone system.

The timing controller 110 generates, on the basis of the timing signal received from the host system, a data timing control signal for controlling operation timing of the data driver 102, a scan timing control signal for controlling operation timing of the scan driver 104, and an EM timing control signal for controlling operation timing of the EM driver 106.

Each of the scan timing control signal and the EM timing control signal includes a start pulse, a shift clock, and the like. The start pulse defines start timing causing a first output to be generated in each of the shift registers of the scan driver 104 and the EM driver 106. The shift register starts to be driven when the start pulse is input thereto, and generates a first output signal at first clock timing. The shift clock defines shift timing of an output signal output from the shift register.

The display panel 100 includes the pixel array AA displaying the input image, and a bezel region BZ outside of the pixel array AA. The pixel array AA includes a plurality of data lines 12, a plurality of scan lines 14, and a plurality of EM lines 16. The scan line 14 and the EM line 16 are perpendicular to the data line 12. Respective pixels 10 of the pixel array AA are arranged in a matrix form.

Meanwhile, an organic light emitting display according to the present disclosure has each subpixel which includes an organic light emitting diode (OLED) and a circuit device for operating the diode, such as a transistor (driving transistor, DRT), etc. The type and the number of the circuit devices included in each subpixel may be variously determined according to functions provided from the circuit devices and design schemes thereof.

Figure 2:
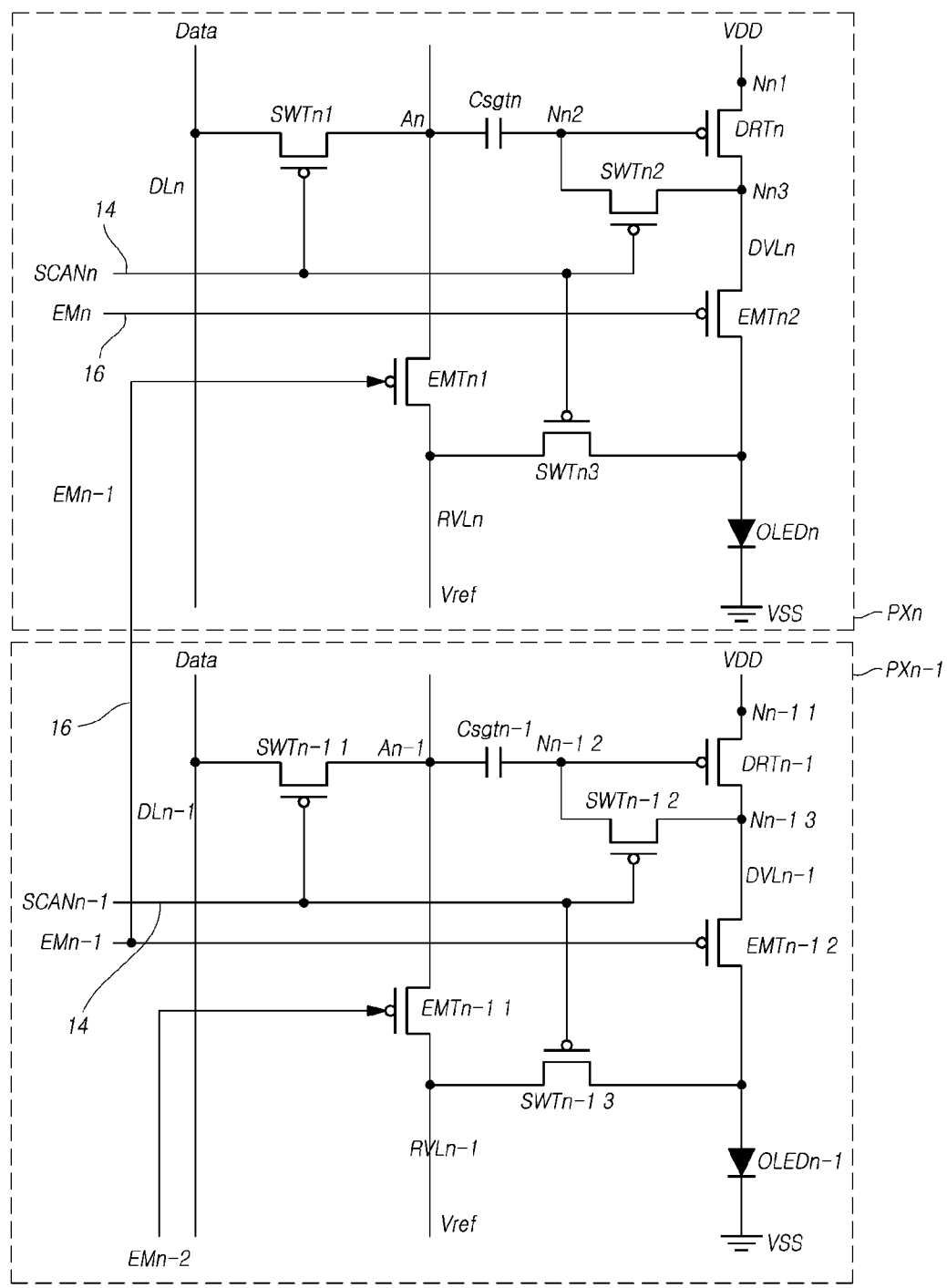
FIG. 2 is a circuit diagram of a pair of subpixels according to an aspect of the present disclosure.

FIG. 2 is a circuit diagram of a pair of subpixels according to an aspect of the present disclosure.

Each pixel 10 may include a red subpixel, a green subpixel, and a blue subpixel and may further include a white subpixel in order to implement colors.

FIG. 2 illustrates a first subpixel PXn and a second subpixel PXn−1, which are a pair of neighboring subpixels.

The first subpixel PXn and the second subpixel PXn−1 are connected with respective VDD lines DVLn and DVLn−1 through which a high potential driving voltage VDD is supplied to each pixel 10, respective reference voltage lines RVLn and RVLn−1 through which a reference voltage Vref (initialization voltages) is supplied to each pixel 10, respective data lines DLn and DLn−1 through which a data voltage DATA is supplied to each pixel 10, and respective VSS electrodes that supply a base voltage VSS.

Also, each of the first subpixel PXn and the second subpixel PXn−1 is connected to the scan line 14 extending from the scan driver 104 and the EM line 16 extending from the EM driver 106, whereby scan signals Scann and Scann−1 and EM signals EMn and EMn−1 may be received.

The first subpixel PXn may include an organic light emitting diode OLEDn, a driving transistor DRTn, first to third switching transistors SWTn1, SWTn2, and SWTn3, first and second light emitting transistors EMTn1 and EMTn2, and a storage capacitor Csgtn.

The second pixel PXn−1, like the first subpixel PXn, may also include an organic light emitting diode OLEDn−1, a driving transistor DRTn−1, first to third switching transistors SWTn−11, SWTn−12, and SWTn−13, first and second light emitting transistors EMTn−11 and EMTn−12, and a storage capacitor Csgtn−1.

Each of the transistors is illustrated as a p-type MOSFET in FIG. 2, but is not limited thereto, and may be implemented as an n-type MOSFET. In this case, phases of the scan signal SCAN and the light emission control signal EM (hereinafter, referred to as an "EM signal") are reversed. Also, each of the transistors may be implemented as one of an amorphous silicon (a-si) thin film transistor (TFT), a poly-silicon TFT, and an oxide semiconductor TFT, or a combination thereof.

Since the first subpixel PXn and the second subpixel PXn−1 have the same structure, hereinafter, the structure and operation of the second subpixel PXn−1 will be described on the basis of the first subpixel PXn.

An anode of the organic light emitting diode OLEDn is connected to the driving transistor DRTn through the second light emitting transistor EMTn2. A cathode of the organic light emitting diode OLEDn is connected to the VSS electrode and receives a base voltage VSS supplied therefrom. The base voltage may be a negative low-potential direct current voltage.

The driving transistor DRTn is a driving device that controls current flowing through the organic light emitting diode OLEDn according to the voltage between a gate and a source. The driving transistor DRTn and the organic light emitting diode OLEDn are connected on the driving voltage line DVL through which driving voltage VDD is supplied.

The driving transistor DRTn includes a gate to which the data voltage DATA is supplied through the first switching transistor SWTn1, a source connected to the driving voltage line to receive a high-potential driving voltage VDD, and a drain connected to the second light emitting transistor EMTn2. The source, the gate, and the drain are referred to as a first node N1, a second node N2, and a third node N3, respectively.

The storage capacitor Csgtn is connected on the line between the gate of the driving transistor DRTn and the data line DLn.

The first to third switching transistors SWTn1, SWTn2, and SWTn3 are turned on in response to a scan signal transferred through the scan line 14. The first switching transistor SWTn1 is a switch device that, when a pixel circuit operates, supplies the data voltage DATA to the gate of the driving transistor DRTn in an initial interval and a sampling interval and maintains an OFF state during a light emitting interval. The first switching transistor SWTn1 includes a gate connected to the scan line 14, a source connected to the data line 12, and a drain connected to the gate of the driving transistor DRTn. The scan signal SCAN is supplied to the pixels through the scan line 14 during an approximate 1 horizontal period. The 1 horizontal period may be an interval between driving signals provided to each subpixel.

The second switching transistor SWTn2 is connected to the line between the second node and the third node of the driving transistor DRTn, and the third switching transistor SWTn3 is connected to the line between the reference voltage line and the driving voltage line. The second switching transistor SWTn2 and the third switching transistor SWTn3, like the first switching transistor SWTn1, are turned on in the initial interval and the sampling interval, and turned off in the light emitting interval.

The first light emitting transistor EMTn1 is installed on the reference voltage line RVL and corresponds to a first light emission control device that is switched in response to the EM signal EM transferred through the EM line 16. The first light emitting transistor EMTn1 receives the EM signal supplied from the EM line 16 of a neighboring previous subpixel. That is, an N-th subpixel receives the EM signal supplied from the EM line 16 connected to an (N-1)-th subpixel. The first light emitting transistor EMTn1 is turned off during the initial interval, the sampling interval, and the holding interval, and is turned on during the light emitting interval so as to provide the reference voltage Vref to a pixel circuit. Accordingly, it is possible to prevent occurrence of a short-circuit between the data voltage DATA and the reference voltage Vref in the initial interval.

The second light emitting transistor EMTn2 is a switching device that switches current flowing through the organic light emitting diode OLEDn in response to the EM signal EM transferred through the EM line 16. The second light emitting transistor EMTn2 maintains an OFF state during the sampling interval and the holding interval, and is turned on or off in response to the EM signal EM during the light emitting interval, so as to switch current of the organic light emitting diode OLEDn. A light-on time and a light-off time of the organic light emitting diode OLEDn may be adjusted according to a duty ratio of the EM signal EM. The second light emitting transistor EMTn2 includes a gate connected to the EM line, a source connected to the driving transistor DRTn, and a drain connected to the anode of the organic light emitting diode OLEDn. The EM signal EM is generated at an OFF level during the sampling interval to block current of the organic light emitting diode OLEDn. The second light emitting transistor EMTn2, unlike the first light emitting transistor EMTn1 receives the EM signal transferred through the EM line 16 connected to the corresponding subpixel. For example, the second light emitting transistor of the first subpixel receives the EM signal supplied through a first EM line, and the second light emitting transistor of the N-th subpixel receives the EM signal supplied through an N-th EM line.

Accordingly, the second light emitting transistor EMTn2 of the first subpixel PXn and the second light emitting transistor EMTn-1 2 of the second subpixel PXn-1 receive respective EM signals transferred through EM lines 16 connected to the first subpixel PXn and the second subpixel PXn-1, and EM signals different from each other are thus input to the second light emitting transistor EMTn2 of the first subpixel PXn and the second light emitting transistor EMTn-1 2 of the second subpixel PXn-1.

Also, the first light emitting transistor EMTn1 of the first subpixel PXn and the first light emitting transistor EMTn-1 1 of the second subpixel PXn-1 receive respective EM signals transferred through EM lines 16 connected to the previous subpixels of the first subpixel PXn and the second subpixel PXn-1, and EM signals different from each other are thus input to the first light emitting transistor EMTn1 of the first subpixel PXn and the first light emitting transistor EMTn-1 1 of the second subpixel PXn-1.

Meanwhile, the first light emitting transistor EMTn1 of the first subpixel PXn receives the EM signal supplied from the second subpixel PXn-1, the previous subpixel of the first subpixel PXn, and thus receives the same EM signal as that of the second light emitting transistor EMTn-1 2 of the second subpixel PXn-1.

That is, the second light emitting transistor EMTn2 of each subpixel receives the EM signal generated in the EM driver 106 connected to the each subpixel. The first light emitting transistor EMTn1 of each subpixel receives the EM signal generated in the EM driver 106 connected to the previous subpixel of the each subpixel. In this regard, it will be described in detail with reference to FIG. 3 as followings.

Figure 3:
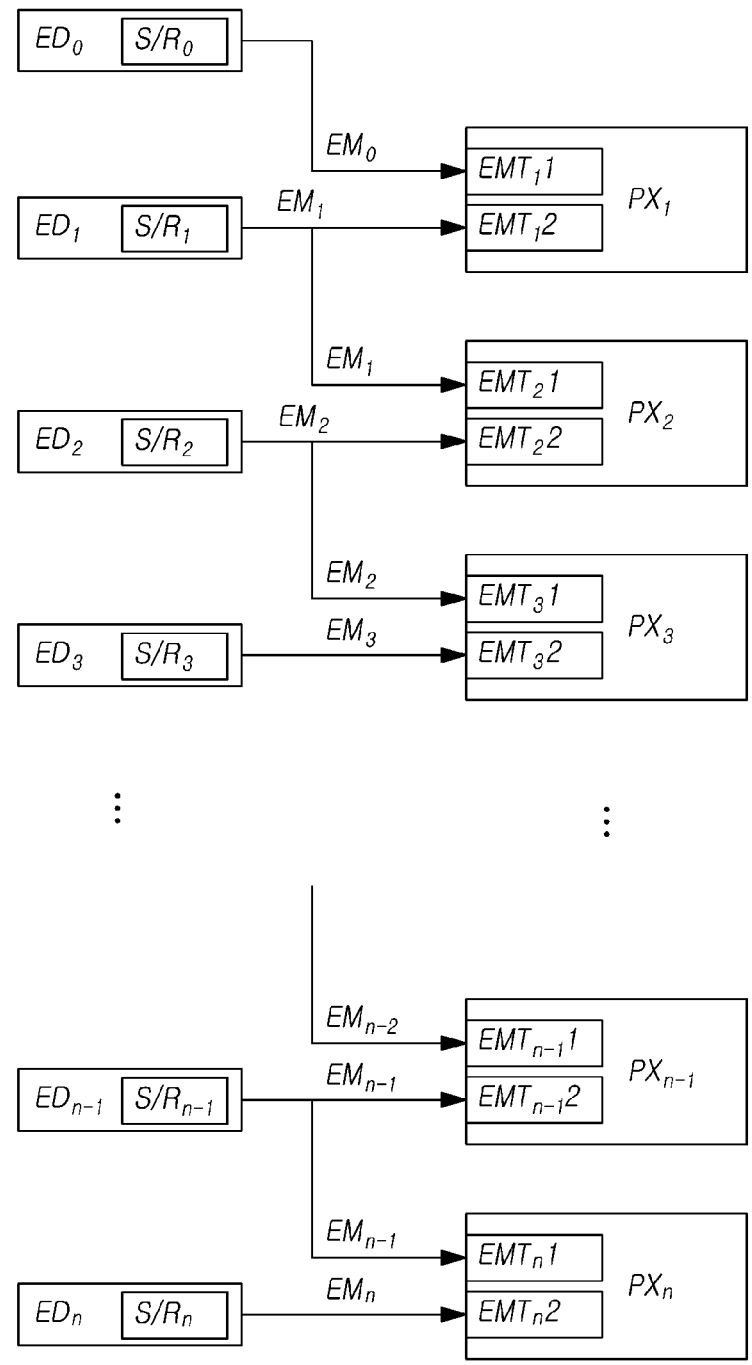
FIG. 3 is a block diagram illustrating an EM signal providing system according to an aspect of present disclosure.

FIG. 3 is a block diagram illustrating an EM signal providing system according to the present disclosure.

As described in FIG. 3, each subpixel includes a corresponding EM driver ED1, ED2, . . . , and EDn, and each of the EM driver ED1, ED2, . . . , and EDn has one shift register S/R1, S/R2, . . . , and S/Rn. Since one shift register is arranged for each EM driver ED1, ED2, . . . , and EDn, each EM driver ED1, ED2, . . . , and EDn generates one EM signal and then outputs the generated one EM signal through the EM line. However, one EM signal output from each EM driver ED1, ED2, . . . , and EDn is supplied to a corresponding subpixel, and, at the same time, is supplied to a neighboring subsequent subpixel. Accordingly, each subpixel receives a pair of EM signals. That is, one of the pairs is the EM signal generated in the EM driver ED1, ED2, . . . , and EDn directly connected to each subpixel, and the other one is the EM signal generated in the EM driver ED1, ED2, . . . , and EDn of the neighboring subpixel. The EM signal generated in the directly connected EM driver ED1, ED2, . . . , and EDn is supplied to the second light emitting transistor EMTn2, and the EM signal generated in the EM driver ED1, ED2, . . . , and EDn of the neighboring subpixel is supplied to the first light emitting transistor EMTn1.

Referring to FIG. 3, subpixel 2 PX2 receives the EM signal supplied from EM driver 2 ED2 connected to subpixel 2 PX2, together with the EM signal generated in the shift register S/R1 of EM driver 1 ED1 connected to subpixel 1 PX1. The EM signal from EM driver 2 ED2 is supplied to the second light emitting transistor EMTn2 of subpixel 2 PX2, and the EM signal from EM driver 1 ED1 is supplied to the first light emitting transistor EMTn1 of subpixel 2 PX2.

Likewise, the first light emitting transistor EMTn1 of subpixel N PXn receives the EM signal supplied from EM driver N-1 EDn-1 connected to subpixel N-1 PXn-1, and the second light emitting transistor EMTn2 receives the EM signal supplied from EM driver N EDn.

Meanwhile, the second light emitting transistor EMTn2 of subpixel 1 PX1 receives the EM signal supplied from EM driver 1 ED1. However, since there is no previous subpixel of subpixel 1 PX1, a dummy EM driver ED0 generating an EM signal is separately configured, and an EM signal generated in the dummy EM driver ED0 is thus provided to the first light emitting transistor EMTn1 of subpixel 1 PX1.

Figure 4:
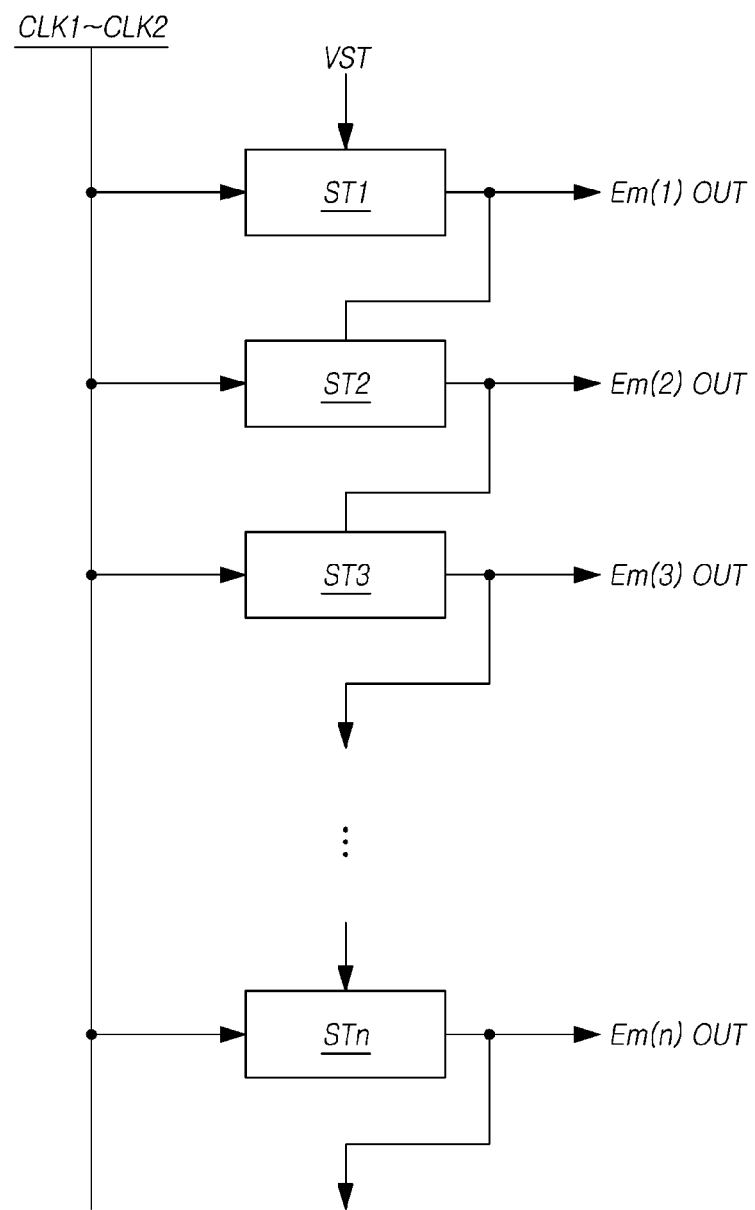
FIG. 4 is a block diagram illustrating an operation of an EM driver.

FIG. 4 is a block diagram briefly illustrating an EM driver.

Each EM driver 106 includes a shift register. The shift register includes dependently connected stages ST1-STn. The shift register receives a start pulse VST and shift clocks CLK1-CLK2, then outputs an EM signal, and then shifts the EM signal to match the timing of the shift clock CLK. EM(1) Out-EM(n) Out in FIG. 4 indicate EM signals to be shifted.

In the present disclosure, since each EM driver 106 outputs only one EM signal, each EM driver 106 is required to have only one shift register. That is, in the conventional devices, each EM driver 106 outputs a pair of EM signals, and is thus required to have a pair of shift registers. However, in the present disclosure, since each EM driver 106 outputs only one EM signal and the other EM signal is supplied from the EM driver 106 of the previous subpixel, only one shift register is required to configure the EM driver 106. Accordingly, the circuit may have a simpler structure, and an area used for circuit configuration is thus reduced, so that a bezel area may be reduced.

FIGS. 5 to 12 are circuit diagrams and timing diagrams illustrating a process for operating a subpixel circuit in the organic light emitting display.

Frame interval 1 of the organic light emitting display is divided into an initial interval, a sampling interval, a holding interval, and a light emitting interval. In the initial interval and the sampling interval, sampling may be performed for a threshold voltage Vth of the driving transistor DRTn, and compensation may be performed for the data voltage as much as the amount of the threshold voltage Vth, in order to compensate for a current deviation of the organic light emitting device OLEDn by using a well-known internal compensation method. In the light emitting interval, pixels are repeatedly turned on and turned off according to the EM signal EM. At this time, the initial interval, the sampling interval, and the holding interval take up about only 1 horizontal period to 2 horizontal periods, and most of the frame interval 1 is thus the light emitting interval.

Figure 5:
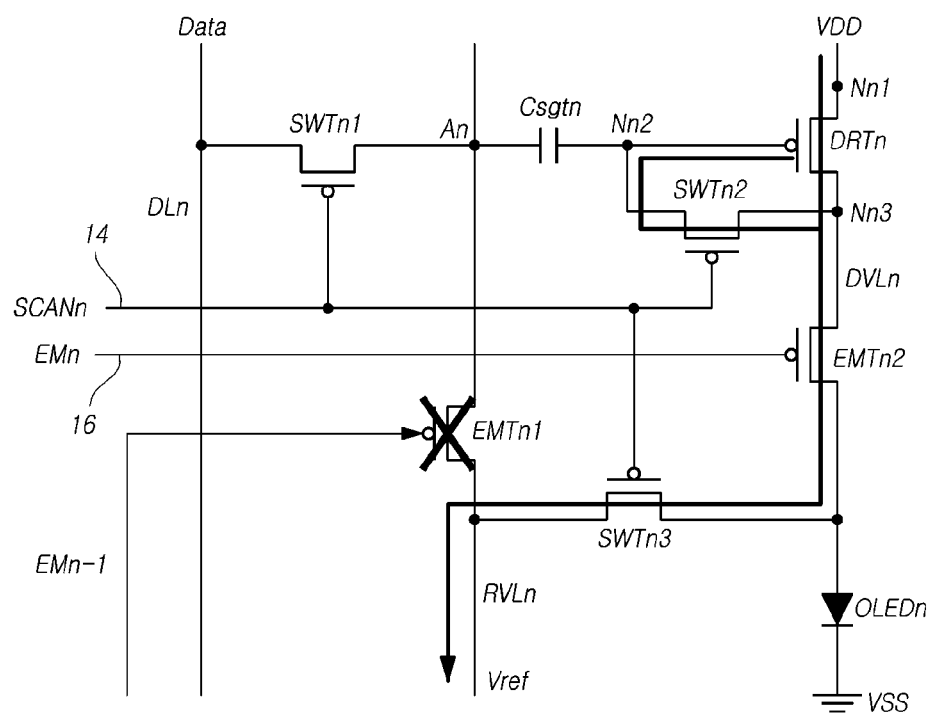
FIGS. 5 to 12 are circuit diagrams and timing diagrams illustrating operation procedures of a subpixel circuit in an organic light emitting display of the present disclosure.
Figure 6:
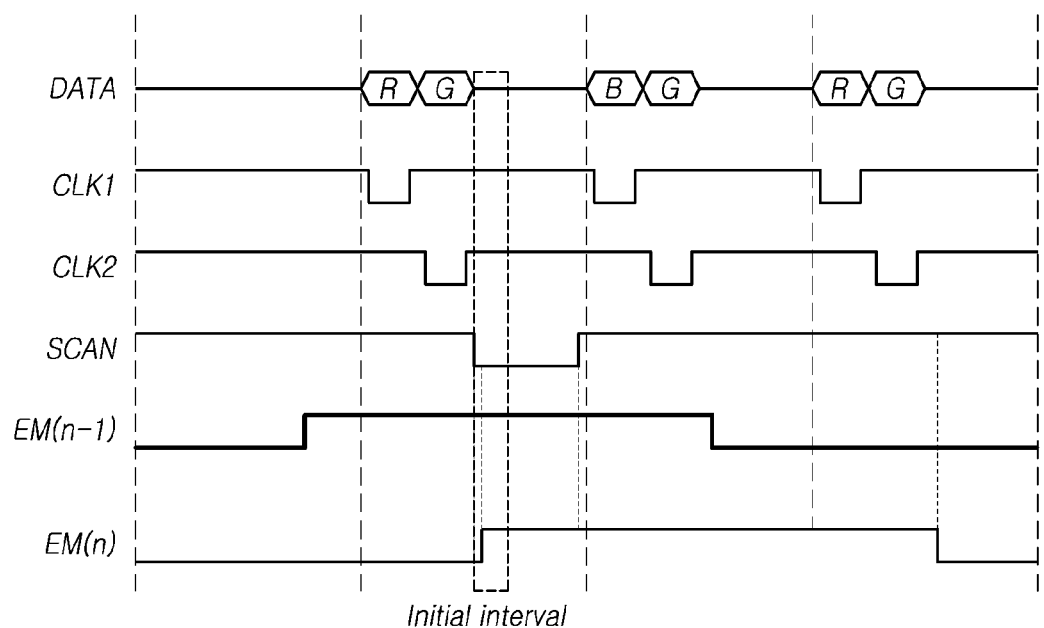

As illustrated in FIGS. 5 and 6, the initial interval begins when a scan signal is input by clock signals CLK1 and CLK2. In the initial interval, the first to third switching transistors SWTn1, SWTn2, and SWTn3 are turned on, and the driving transistor DRTn is turned on by a signal from the first switching transistor SWTn1. Further, the second light emitting transistor EMTn2 maintains turn-on state by the EM signal from the EM driver N. At this time, since the EM signal from previous EM driver N-1 is applied to the first light emitting transistor EMTn1, the first light emitting transistor EMTn1 maintains a turn-off state. Therefore, since the data line DLn is disconnected by the first light emitting transistor EMTn1, an occurrence of a short-circuit due to carrying of the same electric current between the data voltage DATA and the reference voltage Vref during the initial interval can be prevented.

Meanwhile, the EM signal of the present aspect is generated during an interval longer than 1 horizontal period by a predetermined time. In the present disclosure, the EM signal supplied to the first light emitting transistor EMTn1 is supplied from the previous EM driver N-1. Therefore, when the EM signal has a length of 1 horizontal period, at the moment in which the first light emitting transistor EMTn1 is turned on and the second light emitting transistor EMTn2 is turned off, an interval in which the first light emitting transistor EMTn1 and the second light emitting transistor EMTn2 are all turned on due to a delay time may occur. Further, in this case, the data voltage DATA and the reference voltage Vref are carrying the same electric current and therefore a short-circuit may occur. To prevent this, the EM signal of the present aspect is formed to have a length obtained by adding, to 1 horizontal period, at least a delay time occurring at the moment when the first light emitting transistor EMTn1 is turned on and the second light emitting transistor EMTn2 is turned off.

Also, the EM signal is formed to have a maximum length of 2 horizontal periods or shorter in order to prevent the EM signal and an EM signal of the following subpixel from overlapping. As an EM signal of subpixel 1 is provided to the first light emitting transistor EMTn1 of subpixel 2, the EM signal overlaps an EM signal of subpixel 3 when the length of the EM signal is longer than 2 horizontal periods. Accordingly, the EM signal is required to have a minimum length corresponding to a length obtained by adding a delay time to 1 horizontal period, and a maximum length which is 2 horizontal periods or shorter.

Figure 7:
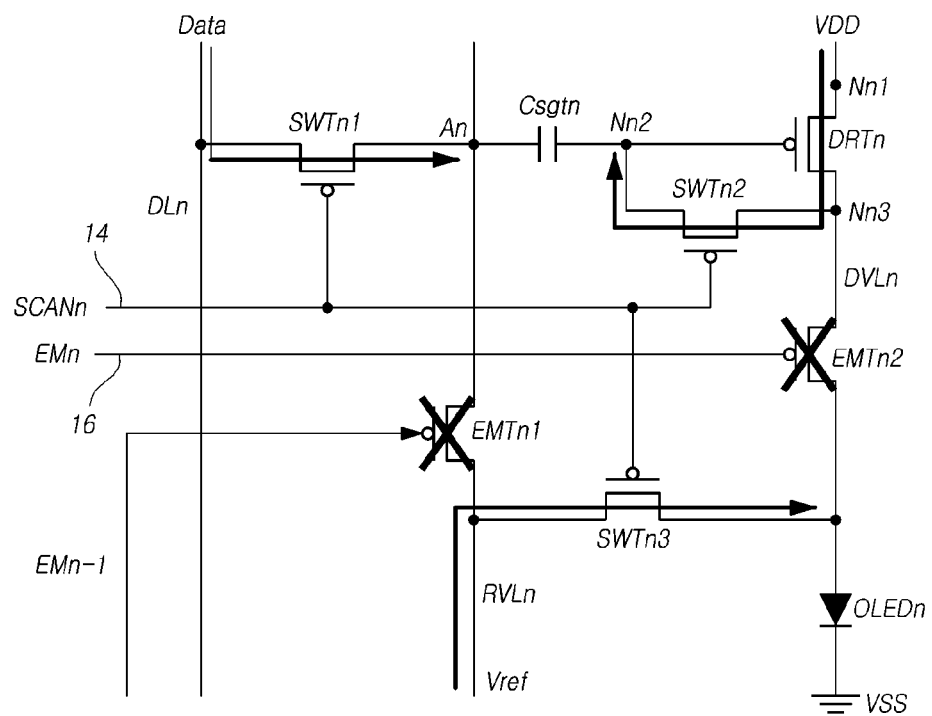
Figure 8:
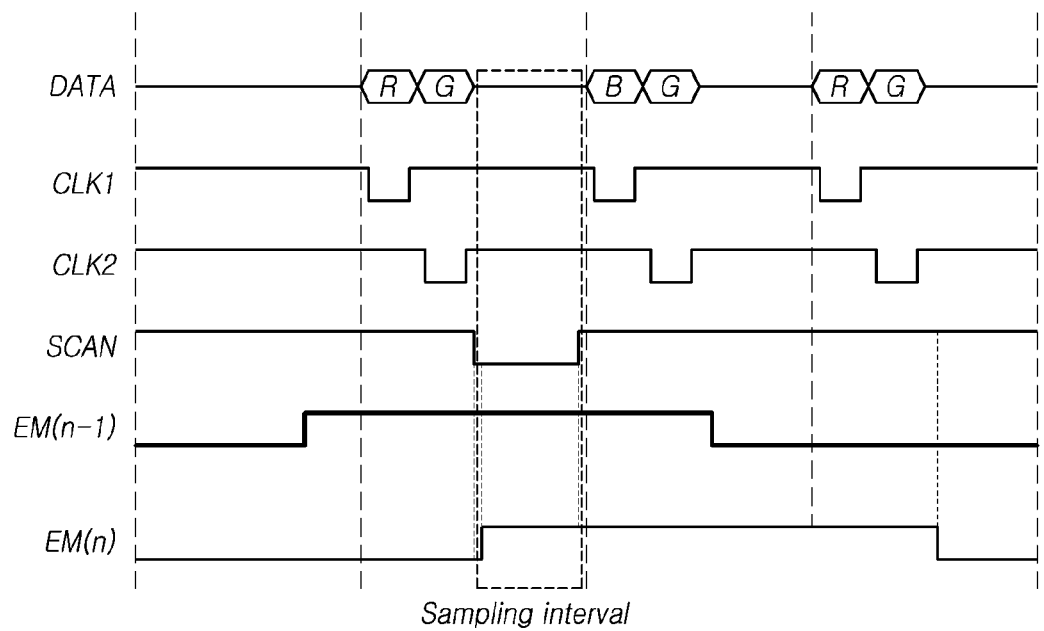

As illustrated in FIGS. 7 and 8, the sampling interval begins when the second light emitting transistor EMTn2 is turned off by the EM signal from the EM driver in a state where the first light emitting transistor EMTn1 is turned off by the EM signal provided from previous EM driver N-1.

In the sampling interval, the first to third switching transistors SWTn1, SWTn2, and SWTn3 maintain turn-on states and the driving transistor DRTn maintains a turn-on state, and the data voltage DATA is thus sensed at A node An, and a voltage as much as the difference between the driving voltage VDD and the threshold voltage Vth of the driving transistor DRTn is applied to the gate of the driving transistor DRTn. At this time, current flows until the voltage Vgs between the gate and the source of the driving transistor DRTn becomes equal to the threshold voltage Vth. That is, current flows until the gate voltage of the driving transistor DRTn is a sum of the driving voltage VDD and the threshold voltage Vth.

Figure 9:
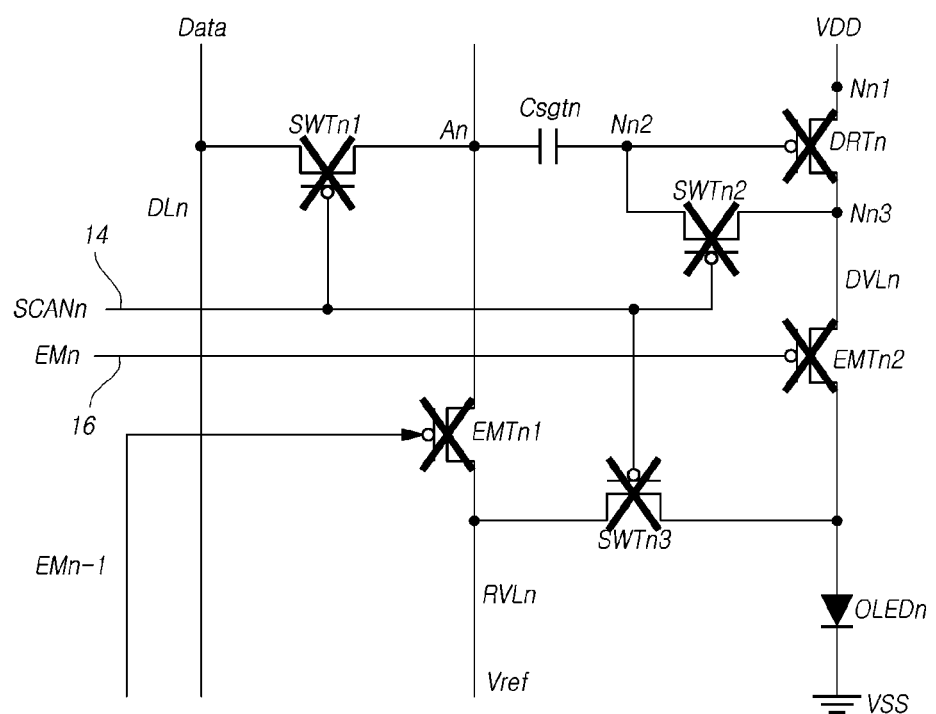
Figure 10:
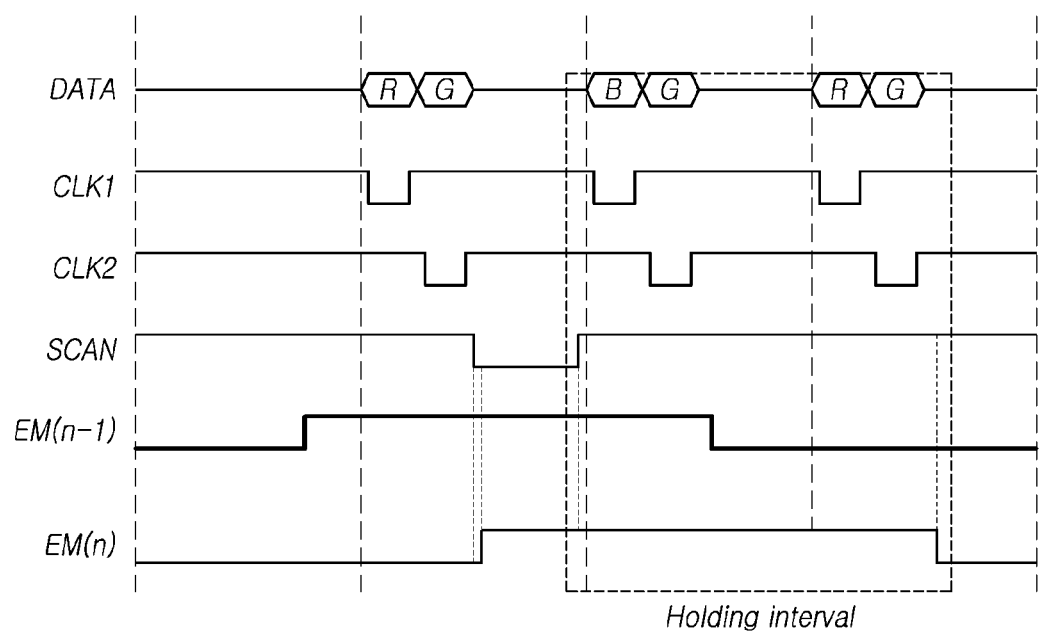

As illustrated in FIGS. 9 and 10, the holding interval refers to an interval from the moment at which the scan signal is in an ON level, to the moment at which the second light emitting transistor EMTn2 is turned on by the EM signal from the EM driver. In the holding interval, all the transistors are turned off and therefore current does not flow in the subpixel circuit.

As illustrated in FIG. 10, when EM signal is generated during 2 horizontal periods, the holding interval becomes longer.

Figure 11:
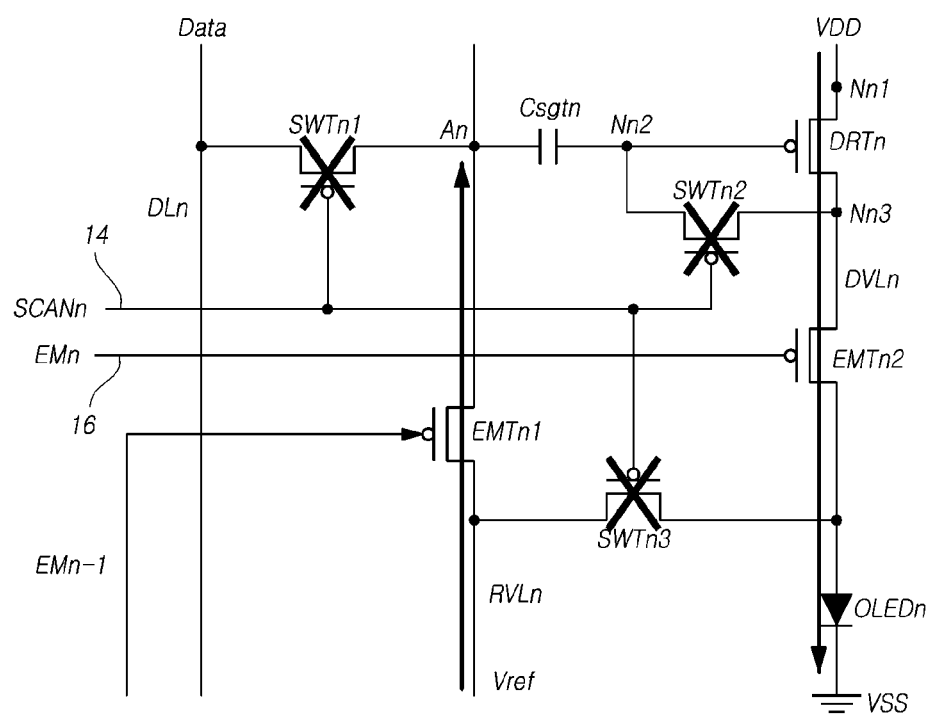
Figure 12:
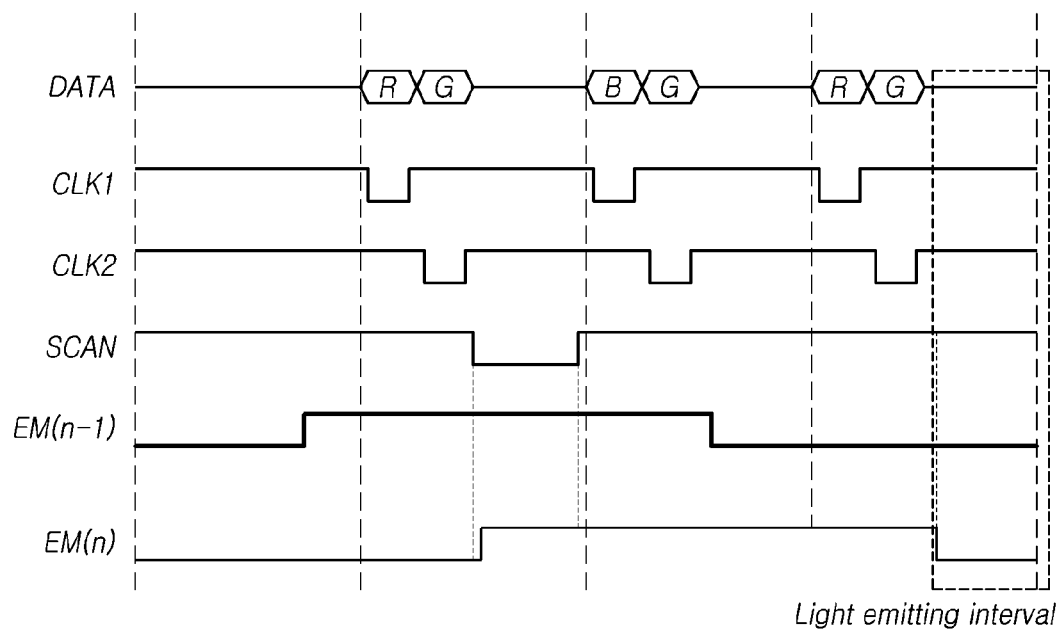

As illustrated in FIGS. 11 and 12, when the EM signal from the EM driver N is in an OFF level, the light emitting interval begins. At this time, the EM signal from the EM driver N-1 is already in an OFF level state, and therefore the first and second light emitting transistors EMTn1 and EMTn2 are all turned on in the light emitting interval. At this time, since the first light emitting transistor EMTn1 is turned on, the reference voltage Vref is applied to the gate of the driving transistor DRTn through the first light emitting transistor EMTn1. Accordingly, the driving transistor DRTn is already turned on. Likewise, since the second light emitting transistor EMTn2 is turned on in a state where the driving transistor DRTn has already been turned on, a driving voltage is provided to the organic light emitting diode OLEDn and therefore the organic light emitting diode OLEDn emits light. At this time, the voltage applied to the gate of the driving transistor DRTn corresponds to a value obtained by (driving voltage VDD−threshold voltage Vth+ (reference voltage Vref−data voltage DATA))).

In the organic light emitting display according to this configuration, only one shift resistor of the EM driver is arranged for each subpixel to generate an EM signal and provide the generated EM signal to the second light emitting transistor EMTn2 of the each subpixel. Further, an EM signal generated in an EM driver of a neighboring subpixel is received and then provided to the first light emitting transistor EMTn1. Accordingly, the first light emitting transistor EMTn1 may maintain a turn-off state from an initial interval to a holding interval, and therefore a short-circuit between the data voltage and the reference voltage, which occurs when the first light emitting transistor EMTn1 is turned on at the initial interval may be prevented.

Meanwhile, an EM driver having one shift register is arranged for each subpixel, and the number of circuit devices can be thus decreased compared to the conventional devices, whereby the size of EM driver can be reduced. The EM driver is disposed in a bezel region in the organic light emitting display, so that the size of the bezel region may be reduced as the size of the EM driver becomes smaller.

The features, structures, effects, and the like described above are included in at least one aspect of the present disclosure, and are not limited to only one aspect. Further, the features, structures, effects, and the like exampled in each aspect can be implemented for other aspects through combination or modification thereof by a person skilled in the field to which the aspects belong. Therefore, it should be interpreted that contents relating to the combination and the modification are included in the scope of the present disclosure.

In addition, descriptions have been provided on the basis of the aspects, but the aspects are merely exemplary and the scope of the present disclosure is not limited by the aspects. Further, a person skilled in the art can notice that various modifications and applications which are not exemplified above are possible without departing from the essential spirit of the present aspect. For example, each element specifically indicated in the aspects may be modified and implemented. Further, it should be interpreted that the differences relating to the modification and application is included in the scope of the present disclosure, which is defined by the accompanied claims.

What is claimed is:

1. An organic light emitting display comprising a display panel where a plurality of pixels, each of which has a plurality of subpixels, are arranged in a matrix form, comprising: a data driver configured to supply a data voltage to the display panel; a scan driver configured to supply a scan signal synchronized with the data voltage; a duty driver configured to generate light emission control signals that controls a duty of the data voltage provided to the plurality of subpixels;
    a first subpixel having a first subpixel circuit comprising a first light emitting device, a first driving device, a first light emission control device and a second light emission control device directly connected with first light emitting device; and
    a second subpixel having a second subpixel circuit comprising a second light emitting device, a second driving device, a third light emission control device and a fourth light emission control device directly connected with second light emitting device,
    wherein the first driving device configured to control a driving voltage provided to the first light emitting device and control the duty of the driving voltage provided to the first light emitting device,
    wherein the first and fourth light emission control devices receive the second light emission control signal through a second emission line, the second light emission control device receives the first light emission control signal through a first emission line, and the first and second emission signals are different from each other.

2. The organic light emitting display of claim 1, wherein the first light emission control device maintains a turn-off state during compensating for a threshold voltage of the driving device during an initial interval of the subpixel, according to the first light emission control signal provided from the neighboring subpixel.

3. The organic light emitting display of claim 1, wherein the light emission control signals have a minimum length of a time longer one of a delay time occurring when the first light emission control device is turned on and a delay time occurring when the second light emission control device is turned off during a 1 horizontal period, and a maximum length to be 2 horizontal periods or shorter.

4. The organic light emitting display of claim 1, wherein the duty driver comprises shift registers have a one-to-one correspondence with each subpixel.

5. The organic light emitting display of claim 1, further comprising a dummy shift register configured to provide a third light emission control signal to the first light emission control device of a subpixel firstly operating in the display panel.

6. The organic light emitting display of claim 1, wherein the first light emission control device keeps a turn-off state during an initial interval, a sampling interval and a holding interval, is turned on during a light emitting interval and provides a reference voltage to the subpixel circuit.

7. The organic light emitting display of claim 6, wherein the first light emission control device prevents a short-circuit between the data voltage and the reference voltage.

8. The organic light emitting display of claim 1, wherein the second light emission control device keeps a turn-off state during a sampling interval and a holding interval and is turned on or turned off during a light emitting interval in response to the light emitting control signals.

9. The organic light emitting display of claim 8, wherein the second light emission control device switches a current on the organic light emitting device in response to the light emitting control signals during the sampling interval.

10. The organic light emitting display of claim 1, wherein the second light emission control device of an N-th subpixel receives an N-th light emitting control signal supplied through an N-th light emitting line, and the second light emitting transistor of an (N−1)-th subpixel receives an N−1-th light emitting control signal supplied through an (N−1)-th light emitting line.

11. The organic light emitting display of claim 1, wherein the first light emission control device of the first subpixel and the second light emission control device of the second subpixel receive the same light emitting control signal.

12. An apparatus for driving an organic light emitting display having a plurality of subpixels that are turned on and off according to a light emission control signal during a duty operation period, the apparatus comprising:
    a duty driver configured to generate a light emission control signal that controls a duty of a data voltage provided from the plurality of subpixels and include a plurality of shift registers having a one-to-one correspondence with the plurality of subpixels,
    a first subpixel having a first subpixel circuit comprising a first light emitting device, a first driving device, a first light emission control device and a second light emission control device directly connected with first light emitting device; and
    a second subpixel having a second subpixel circuit comprising a second light emitting device, a second driving device, a third light emission control device and a fourth light emission control device directly connected with second light emitting device,
    wherein the first and fourth light emission control devices receive the second light emission control signal through a second emission line, the second light emission control device receives the first light emission control signal through a first emission line, and the first and second emission signals are different from each other, and
    wherein each of the plurality of shift registers is configured to provide the same light emission control signals to a pair of neighboring subpixels, so as to control a pair of different light emission control signals to be provided to each of the subpixels.

13. The apparatus for driving an organic light emitting display of claim 12, wherein the plurality of shift registers are configured to provide the same light emission control signals to subpixels corresponding to the shift registers and subpixels disposed subsequent to the subpixels.

14. The apparatus for driving an organic light emitting display of claim 12, wherein the light emission control signals have a minimum length to be extended to be longer one of a delay time occurring when the first light emission control device is turned on and a delay time occurring when the second light emission control device is turned off during a t horizontal period and a maximum length to be 2 horizontal periods or shorter.

15. The apparatus for driving an organic light emitting display of claim 12, further comprising a dummy shift register configured to provide a light emission control signal to a subpixel operating at a first time.

16. An organic light emitting display comprising a display panel having a plurality of subpixels including neighboring first and second subpixels, a data driver supplying a data voltage to the display panel and a scan driver supplying a scan signal synchronized with the data voltage, comprising:
   a light emission driver sequentially supplying first and second light emission control signals to first and second light emission control lines to configure to provide the same light emission control signals to the neighboring first and second subpixels;
   wherein the first subpixel includes a first subpixel circuit comprising a first light emitting device, a first driving device, a first light emission control device and a second light emission control device directly connected with first light emitting device;
   wherein the second subpixel includes a second subpixel circuit comprising a second light emitting device, a second driving device, a third light emission control device and a fourth light emission control device directly connected with second light emitting device,
   wherein the first driving device configured to control a driving voltage provided to the first light emitting device and control the duty of the driving voltage provided to the first light emitting device, and
   wherein the first and fourth light emission control devices receive the second light emission control signal through the second light emission line, the second light emission control device receives the first light emission control signal through the first light emission line, and the first and second emission signals are different from each other.

17. The organic light emitting display of claim 16, wherein the light emission driver comprises a plurality of shift registers having a one-to-one correspondence with the plurality of subpixels.

18. The organic light emitting display of claim 16, wherein the light emission control signals have a minimum length to be extended to be longer one of a delay time occurring when the first light emission control device is turned on and a delay time occurring when the second light emission control device is turned off during a 1 horizontal period and a maximum length to be 2 horizontal periods or shorter.

19. The organic light emitting display of claim 16, further comprising a dummy shift register configured to provide a light emission control signal to a subpixel operating at a first time.

20. The organic light emitting display of claim 16, wherein the first light emission control device prevents a short-circuit between the data voltage and a reference voltage.

* * * * *